(12) United States Patent
Andreas et al.

(10) Patent No.: US 6,835,668 B2
(45) Date of Patent: Dec. 28, 2004

(54) COPPER POST-ETCH CLEANING PROCESS

(75) Inventors: Michael T. Andreas, Boise, ID (US); Paul A. Morgan, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 10/255,854

(22) Filed: Sep. 25, 2002

(65) Prior Publication Data

US 2003/0077903 A1 Apr. 24, 2003

Related U.S. Application Data

(62) Division of application No. 10/083,035, filed on Oct. 24, 2001, now Pat. No. 6,589,882.

(51) Int. Cl.$^7$ ............................................. H01L 21/302
(52) U.S. Cl. ........................................ 438/745; 438/742
(58) Field of Search ................................ 438/687, 689, 438/745, 754, 637, 692, 638–690, 622–4, 742; 216/100–109

(56) References Cited

U.S. PATENT DOCUMENTS

| | | | |
|---|---|---|---|
| 3,831,265 A | | 8/1974 | Louzon et al. |
| 4,415,606 A | * | 11/1983 | Cynkar et al. ................. 438/4 |
| 4,938,257 A | | 7/1990 | Morris |
| 5,017,267 A | | 5/1991 | Cordani |
| 5,213,622 A | | 5/1993 | Bohling et al. |
| 5,382,296 A | | 1/1995 | Anttila |
| 5,633,121 A | | 5/1997 | Namiki et al. |
| 5,681,398 A | | 10/1997 | Muraoka |
| 5,861,076 A | | 1/1999 | Adlam et al. |
| 5,863,344 A | | 1/1999 | Nam |
| 5,939,334 A | * | 8/1999 | Nguyen et al. ............. 438/689 |
| 6,083,840 A | | 7/2000 | Mravic et al. |
| 6,124,214 A | * | 9/2000 | Hembree et al. ........... 438/745 |
| 6,136,767 A | | 10/2000 | Hineman et al. |
| 6,143,658 A | | 11/2000 | Donnelly, Jr. et al. |
| 6,204,169 B1 | * | 3/2001 | Bajaj et al. .................. 438/645 |
| 6,232,228 B1 | | 5/2001 | Kwag et al. |
| 6,319,543 B1 | | 11/2001 | Soutar et al. |
| 6,361,712 B1 | | 3/2002 | Honda et al. |
| 6,362,106 B1 | * | 3/2002 | Kaufman et al. ........... 438/692 |
| 6,391,794 B1 | | 5/2002 | Chen et al. |
| 6,541,391 B2 | | 4/2003 | Smith et al. |
| 6,599,370 B2 | * | 7/2003 | Skee ............................. 134/3 |
| 6,653,243 B2 | * | 11/2003 | Morgan ...................... 438/745 |
| 2002/0119656 A1 | | 8/2002 | Smith et al. |

OTHER PUBLICATIONS

Walker, P. et al. "Handbook of Metal Etchants", CRC Press 1991, pp. 90–91.

* cited by examiner

Primary Examiner—Kamand Cuneo
Assistant Examiner—Lisa Kilday
(74) Attorney, Agent, or Firm—Wells St. John P.S.

(57) ABSTRACT

The invention includes a method of cleaning a surface of a copper-containing material by exposing the surface to an acidic mixture comprising $NO_3^-$, $F^-$ and one or more organic acid anions having carboxylate groups. The invention also includes a semiconductor processing method of forming an opening to a copper-containing material. A mass is formed over a copper-containing material within an opening in a substrate. The mass contains at least one of an oxide barrier material and a dielectric material. A second opening is etched through the mass into the copper-containing material to form a base surface of the copper-containing material that is at least partially covered by particles comprising at least one of a copper oxide, a silicon oxide or a copper fluoride. The base surface is cleaned with a solution comprising nitric acid, hydrofluoric acid and one or more organic acids to remove at least some of the particles.

18 Claims, 1 Drawing Sheet

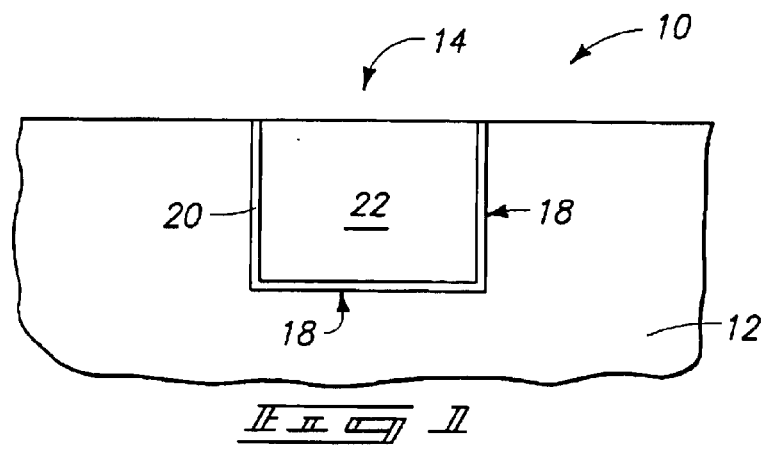
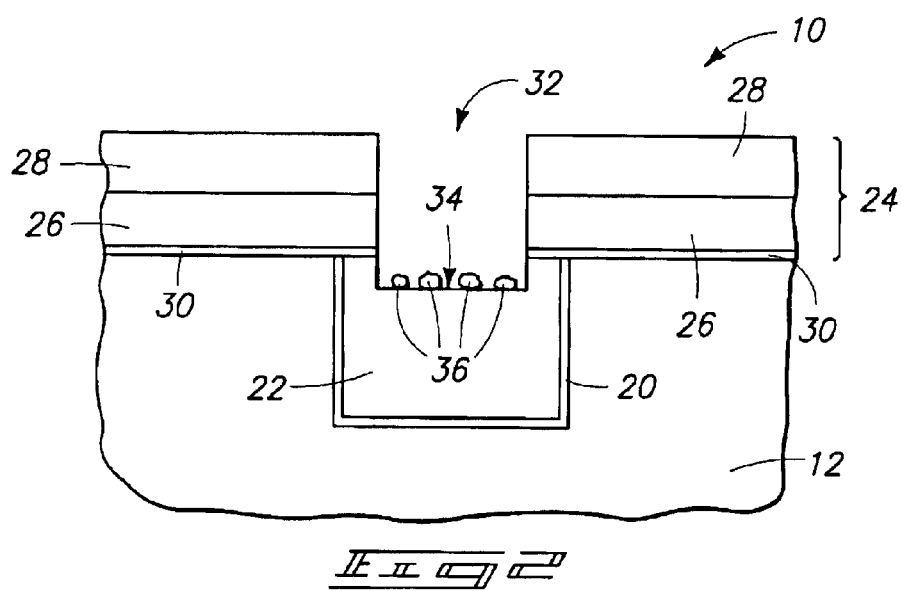
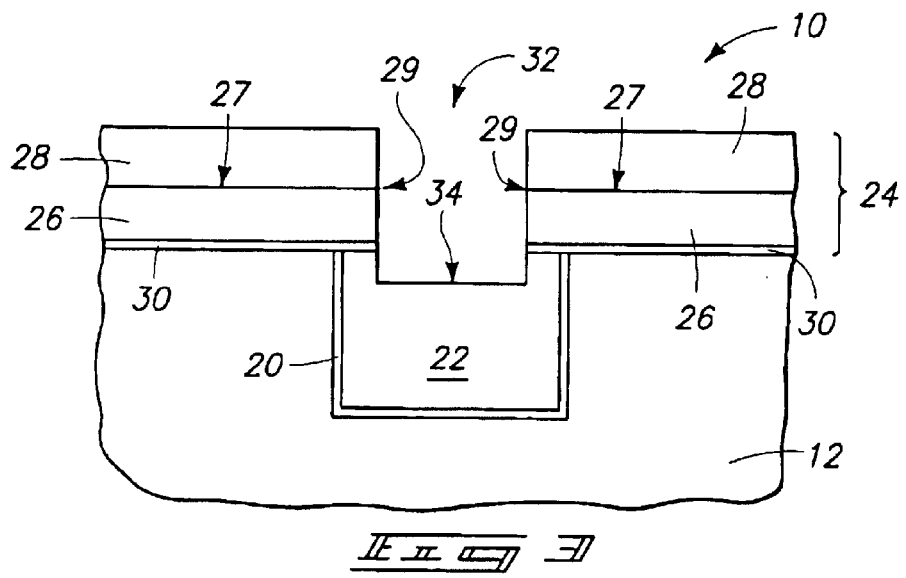

COPPER POST-ETCH CLEANING PROCESS

CROSS REFERENCE TO RELATED APPLICATION

This application is a divisional of U.S. patent application Ser. No. 10/083,035 which was filed on Oct. 24, 2001 now U.S. Pat No. 6,589,882 and which is incorporated by reference herein.

TECHNICAL FIELD

The invention pertains to methods of cleaning surfaces of copper-containing materials. In particular embodiments, the invention pertains to semiconductor processing methods of forming openings to copper-containing substrates.

BACKGROUND OF THE INVENTION

Copper has a relatively high conductance compared to many other elements, and accordingly can be desired for utilization as a wiring layer in various circuitry applications. For instance, in semiconductor processing applications, it can be desired to provide copper wiring layers as electrical paths to various integrated circuit components.

A difficulty in utilizing copper in semiconductor processing applications is that it can be difficult to clean. For instance, copper-containing materials will frequently have a surface to which electrical connection with other conductive components is ultimately to occur. Formation of such electrical connection will frequently involve providing a conductive material over the surface of the copper-containing material. The conductive material is intended to physically contact the surface of the copper-containing material to form an electrical connection with the copper-containing material. However, if the surface of the copper-containing material is partially or entirely covered with debris, the physical connection of the conductive material and copper surface can be impaired. Such impairment can lead to attenuation of electrical current passing between the copper-containing layer and the conductive material formed thereover.

It would be desirable to develop improved methods of cleaning copper-containing surfaces to remove debris from over the surfaces prior to forming conductive materials thereon.

SUMMARY OF THE INVENTION

In one aspect, the invention encompasses a semiconductor processing method of cleaning a surface of a copper-containing material by exposing the surface to a mixture having an acidic pH and comprising $NO_3^-$, $F^-$ and one or more organic acid anions, where at least some of the organic acid anions contain carboxylate groups.

In another aspect, the invention includes a semiconductor processing method of forming an opening to a copper-containing material within a substrate. The substrate contains a semiconductor material and has a first opening. A copper-containing material is provided within the first opening and a mass is formed over the substrate and over the copper-containing material. The mass comprises at least one of an oxide barrier material and a dielectric material. A second opening is etched through the mass into the copper-containing material. A surface of the copper-containing material defines a base of the second opening and is referred to as a base surface. The base surface of the copper-containing substrate is at least partially covered by at least one of a copper oxide, a silicon oxide or a copper fluoride. The base surface is cleaned with a cleaning solution having an acidic pH and comprising nitric acid, hydrofluoric acid and one or more organic acids. At least some of the organic acids have one or more carboxylic acid groups. The cleaning removes at least some of the at least one of a copper oxide, a silicon oxide and a copper fluoride from the base surface.

BRIEF DESCRIPTION OF THE DRAWINGS

Preferred embodiments of the invention are described below with reference to the following accompanying drawings.

FIG. 1 is a diagrammatic, fragmentary, cross-sectional view of a semiconductor wafer fragment at a preliminary step of a processing method of the present invention.

FIG. 2 is a view of the FIG. 1 wafer fragment shown in a processing step subsequent to that of FIG. 1.

FIG. 3 is a view of the FIG. 1 wafer fragment shown in a processing step subsequent to that of FIG. 2.

DETAILED DESCRIPTION OF THE PREFERRED EMBODIMENTS

This disclosure of the invention is submitted in furtherance of the Constitutional purposes of the U.S. Patent Laws "to promote the progress of science and useful arts" (Article 1, Section 8).

The invention encompasses utilization of a mixture comprising $NO_3^-$, $F^-$ and one or more organic acid anions, where at least some of the organic acid anions comprise one or more carboxylate groups, for cleaning surfaces of copper-containing materials. A wide range of organic acids that comprise carboxylic acid groups may be utilized for purposes of the present invention. Examples of such acids include, but are not limited to, formic acid, acetic acid and $CH_3(CH_2)_xCO_2^-$, where x is less than or equal to 3. In the discussion examples that follow acetic acid is used as an exemplary acid for purposes of explaining the present invention. It is to be understood, however, that the present invention, encompasses numerous alternative organic acids.

The mixture for cleaning surfaces of copper-containing materials can be formed by, for example, combining an acetic acid solution (which can be obtained as, for example, a 99.8% (by weight) solution), an HF solution (which can be obtained as, for example, a 49% (by weight) solution of HF in water), an $HNO_3$ solution (which can be obtained as, for example, a 70.4% (by weight) solution of $HNO_3$ in water) and $H_2O$. The pH of the mixture is acidic and preferably is less than about 6, more preferably from about 1 to about 4, and yet more preferably from about 1 to about 2.

If the one or more organic acids used in the cleaning solution comprises acetic acid, the relative amounts of acids contained in the final solution used for cleaning can be, for example, from about 3% to about 20% acetic acid by weight, from about 0.1% to about 2% $HNO_3$ by weight, and from about 0.05% to about 3.0% HF by weight.

The cleaning solution can be utilized without adjustment of the resulting pH after mixing water and acid solutions. Alternatively, a base can be added to the mixture to adjust the mixture to a desired pH within the acidic range. An exemplary base for purposes of the pH adjustment is $NH_4OH$, although other bases can be used alternatively or in addition to $NH_4OH$.

Although the above-described process forms a mixture comprising a base cation in combination with the acetate anion, $NO_3^-$ and $F^-$ by adding a base to an acidic mixture of HF, acetic acid, and $HNO_3$, it is to be understood that identical mixtures can be formed by combining various salts in an aqueous solution. For instance, if a base cation is $NH_4^+$, a mixture of the base cation with the acetate anion, $NO_3^-$, and $F^-$ can be formed by combining $NH_4F$ with ammonium acetate and $NH_4NO_3$. Alternatively, the mixture can be formed by combining one or more ammonium salts selected from the group consisting of $NH_4F$, $NH_4NO_3$, and ammonium acetate with one or more acid selected from the group consisting of acetic acid, HF and $HNO_3$.

The mixtures formed by the above described combination of acid solution where the pH of the solution is not adjusted, will preferably consist essentially of $NO_3^-$, $F^-$, and the acetate anion, together with equilibrium components of $H_3O^+$ and $H_2O$. The equilibrium components of $H_3O^+$ and $H_2O$ will be understood by persons of ordinary skill in the art to comprise chemicals in equilibrium with $H_3O^+$ and $H_2O$, such as for example, $OH^-$ (i.e., the hydroxide anion). Another way of describing a mixture of the present invention is as an aqueous mixture comprising non-aqueous anions consisting essentially of the acetate anion, $NO_3^-$ and $F^-$, or, in particular embodiments, comprising non-aqueous anions consisting of the acetate anion, $NO_3^-$ and $F^-$. Such description considers the equilibrium components of $H_3O^+$, $OH^-$ and $H_2O$ to be aqueous components of the mixture. Yet another way of describing a mixture of the, present invention is that such mixture is a solution in which the only non-hydroxide anions consist essentially of the acetate anion, $NO_3^-$ and $F^-$, or in particular embodiments, consist of the acetate anion, $NO_3^-$ and $F^-$.

An advantage of using a solution comprising acetate, $NO_3^-$ and $F^-$ for cleaning copper in semiconductor fabrication processes is that such solution can remove a variety of common contaminants in a single processing step. For instance, HF or $F^-$ can remove silicon oxides (for example, $SiO_2$), as well as copper oxides; and $HNO_3$ or $NO_3^-$ can remove elemental copper. The solution of the present invention can also remove copper oxides (such as for example, $Cu_2O$ and CuO), and copper fluorides (CuF and $CuF_2$).

In addition, it is advantageous for the solution to comprise an organic acid comprising one or more carboxylic acid groups, for instance, acetic acid, rather than an inorganic acid such as, for instance, HCl, because the cleaning solution comprising the organic acid can be more selective for contaminating particles such as copper oxides, silicon oxides and elemental copper, relative to various semiconductor structural components than could the corresponding cleaning solution where the organic acid is replaced with, for example, HCl. For this reason, the cleaning solution of the present invention that comprises an organic acid rather than HCl is more compatible with structural components such as: aluminum nitride; a composition comprising silicon, carbon and hydrogen; copper; low-k dielectric materials, and organic materials. The cleaning solution of the present invention comprising organic acid can also be more selective relative to aluminum oxide than the corresponding cleaning solution comprising HCl. Therefore, if aluminum oxide is a structural element, the cleaning solution of the present invention will be less likely to etch the aluminum oxide element during the cleaning than a corresponding hydrochloric acid cleaning solution.

A semiconductor processing method incorporating a copper cleaning procedure encompassed by the present invention is described with reference to FIGS. 1–3.

Referring first to FIG. 1, a semiconductive material wafer fragment 10 is illustrated at a preliminary processing step. Wafer fragment 10 comprises a semiconductive material substrate 12 having a first opening 14 therein. A copper-containing material 22 is formed within first opening 14. Substrate 12 can comprise, for example, a monocrystalline silicon wafer having various levels of circuitry formed there over. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Copper-containing material 22 can comprise, for example, a copper alloy, a copper compound, or elemental copper, and can be formed by, for example, sputter deposition. In particular embodiments, copper-containing material 22 will consist essentially of elemental copper (or consist of elemental copper) and will define a wiring layer for connecting various circuitry components (not shown) associated with fragment 10.

In addition to the features described above, semiconductive material wafer fragment 10 can comprise a copper-barrier material 20. As shown in FIG. 1, copper-barrier material 20 can form a layer within first opening 14, and can be over the surface 18 and the sidewalls 16 of the opening. Copper-containing material 22 can be formed over copper-barrier material 20. Copper-barrier material 20 can comprise, for instance, one or more of Ta, TaN, Ti, TiN, and W. In particular embodiments, copper-barrier material could consist essentially of, one or more of Ta, TaN, Ti, TiN, and W.

Referring to FIG. 2, a mass 24 is formed over substrate 12 and over copper-containing material 22. Mass 24 comprises at least one of an oxide barrier material (for example, $Al_2O_3$, $SiO_2$, SiC, silicon oxynitride or a composition comprising silicon, carbon and hydrogen) and a dielectric material (for example, $SiO_2$, SiO, and low-k dielectric materials such as: SILK™, Dow Chemical Corp.; BLACK DIAMOND™, Applied Materials; and CORAL™, Novellus). The shown mass 24 comprises two layers 26 and 28 which are formed one atop the other. One of the layers 26 and 28 can comprise an oxide barrier material and the other of the layers can comprise a dielectric material. For instance, layer 26 could consist essentially of $Al_2O_3$, $SiO_2$, silicon oxynitride, or a composition comprising silicon, carbon, and hydrogen (or in particular embodiments, layer 26 could consist of $Al_2O_3$, $SiO_2$ or silicon oxynitride) and layer 28 could consist essentially of $SiO_2$, low-k dielectric materials (see above), and SiO, (or in particular embodiments, layer 28 could consist of $SiO_2$, low-k dielectric material, or SiO). Such layers 26 and 28 can be formed by, for example, chemical vapor deposition.

In addition to the above described features, mass 24 can comprise a layer of barrier material 30 over copper-containing material 22. As shown, layer 30 can be between copper-containing material 22 and layers 26 and 28 of mass 24. Barrier material 30 can comprise, for instance one or more of a bottom anti-reflective coat material (BARC), a dielectric anti-reflective coat material (DARC), aluminum nitride, or silicon carbide materials such as BLOK™ (Applied Materials). Layer 30 can be formed, for instance, by chemical vapor deposition.

Still referring to FIG. 2, a second opening 32 is etched through mass 24, and specifically is etched through both layers 26 and 28. In embodiments having layer 30, opening 32 can be formed by an open barrier etch process that etches through layer 30 to expose copper-containing material 22, as shown. In alternate embodiments, a closed etch process may be utilized to form opening 32. A closed etch can allow at least some thickness of layer 30 to remain over copper-containing material 22 such that copper-containing material is not exposed (not shown). Opening 32 can be formed by, for example, photolithographic processing wherein a photoresist masking layer (not shown) is formed over mass 24 and patterned to protect some of mass 24 while leaving a portion of mass 24 exposed to etching conditions which ultimately form opening 32.

In embodiments that comprise an open etch, opening 32 can extend to an upper surface 34 of copper-containing material 22. Surface 34 defines a base of opening 32, and the portion of surface 34 within opening 32 can be referred to as a base surface.

Base surface 34 is partially covered by contaminating particles 36. Such contaminating particles can comprise, for example, one or more of a copper oxide, a silicon oxide, a copper fluoride, or a carbon containing residue such as carbon-fluoride polymers. Additionally, particles 36 can comprise elemental copper left over from a sputter deposition of copper-containing material 22. The copper oxide, silicon oxide, copper fluoride, or carbon-fluoride polymer particles can be formed, for example, during the etch through layers 26 and 28. For instance, the silicon oxide can be formed by either oxidation of a silicon nitride component of mass 24, or by debris occurring during the etch of a silicon oxide component of mass 24. As another example, copper oxide can be formed from portions of copper-containing material 22 exposed to etching conditions, if such conditions comprise oxidative components. As yet another example, copper fluoride can be formed from portions of copper-containing material 22 exposed to etching conditions if such conditions comprise a fluorine-containing etchant such as, for example, $CF_4$.

Although base surface 34 is shown to be only partially covered by contaminating particles 36, it is to be understood that such particles can entirely cover base surface 34. The particles 36 can also be deposited on the sidewalls of opening 32 and on the surface of 28.

Although the contaminating particles 36 are described as being formed during formation of opening 32, it is to be understood that particles 36 could be formed during other processing steps, such as for example, as residuals from a chemical mechanical polishing process step.

Referring to FIG. 3, contaminating particles 36 (FIG. 2) are removed from base surface 34 by cleaning such surface with a mixture of the present invention comprising $NO_3^-$, $F^-$, and one or more organic acid anions, wherein the organic acid anions comprise one or more carboxylate groups, such as a composition with an acidic pH and comprising $NO_3^-$, $F^-$, and the acetate anion. More specifically, base surface 34 is cleaned by exposing the surface to the mixture of the present invention which is described above for removing copper oxide, silicon oxide, copper fluoride, and elemental copper from over base surface 34 in one cleaning step. Such cleaning solution preferably is an aqueous mixture comprising ionic components, with the ionic components consisting essentially of $F^-$, $NO_3-$, and one or more organic acid anions having one or more carboxylate groups. Such organic acid anions can be for example formate, acetate, or $CH_3(CH_2)_xCO_2^-$, where x is less than or equal to 3. The cleaning mixture can have such preferred composition at least until base surface 34 is exposed to the mixture. Once base surface 34 is exposed to the mixture, a composition of the mixture can change to include components released from particles 36 (FIG. 2) during the removal of particles 36 from over base surface 34 with the mixture.

The exposure of base surface 34 to the mixture comprising $NO_3-$, $F^-$, and one or more organic acid anions can occur for a time from about 10 seconds to about 1 hour at a temperature from about 10° C. to about 40° C., and at atmospheric pressure. The temperature can comprise, for example, ambient temperature (typically from 20° C. to 30° C.). Such exposure to the mixture can comprise, for example, immersion, submersion, spray-rinsing, brush-scrubbing, spin-processing, agitation, recirculation, spray-application, the use of megasonics, or a combination of any of these techniques.

Relative amounts of $F^-$, $NO_3^-$ and organic acid anions within a cleaning mixture of the present invention can be varied depending upon particular cleaning conditions. For instance, if a large amount of silicon oxide contamination is expected to be present, the concentration of $F^-$ can be increased relative to the concentrations of $NO_3^-$ and organic acid anions. On the other hand, if elemental copper is particularly problematic, the concentration of $NO_3^-$ can be increased relative to the concentrations of $F^-$ and organic acid anions. Further, if copper oxides are particularly problematic, the concentration of organic acid anions can be increased relative to the concentrations of $NO_3^-$ and $F^-$. Also, it can be desirable to increase the total concentration of organic acid anions, $NO_3^-$ and $F^-$ to accomplish faster cleaning of a copper-containing substrate. Faster cleaning can also be accomplished by increasing a temperature of the cleaning solution and/or a temperature of the copper-containing material during a cleaning process.

Relative concentrations of $NO_3^-$, $F^-$ and organic acid anions can also be varied to avoid having one or more of the various anions etching non contaminating portions of wafer fragment 10. For instance, a method of exposing base surface 34 to a cleaning solution of the present invention is to dip a wafer comprising fragment 10 into a cleaning solution of the present invention for a time of about 5 minutes. Such dip would expose layers 26 and 28 to the cleaning solution, as well as exposing base surface 34 to the cleaning solution. If one or both of layers 26 and 28 comprise silicon dioxide, the silicon dioxide would be expected to be etched by $F^-$ present in the cleaning solution. Such etching could alter a configuration of layers 26 and 28 if the concentration of $F^-$ where sufficiently high, or if the time of exposure where sufficiently long. For instance, if an interface 27 is defined at a location where layers 26 and 28 join, and if it is considered that one of layers 26 and 28 comprises silicon nitride and the other comprises silicon dioxide, then the exposure to $F^-$ in the cleaning solution may form divit at locations 29 where interface 27 is exposed along sidewalls of opening 32. A method of avoiding such divit formation is to adjust a concentration of $F^-$ within the cleaning solution that the $F^-$ concentration is only enough to remove contaminating particles 36 from base surface 34. In other words, to adjust the concentration of $F^-$ within the cleaning solution so that there is enough $F^-$ to remove particles 36, but not enough to detrimentally affect exposed silicon oxide surfaces of mass 24 during the time of exposure to the cleaning solution.

Preferably, if a silicon oxide containing surface of mass 24 is exposed to a cleaning solution of the present invention during a cleaning of base surface 34, the concentration of $F^-$ within the mixture will be such that less than 5 angstroms of silicon oxide is removed from the exposed surface of mass 24 during the cleaning of the base surface.

In addition to the features described above, the present invention can be used to clean contaminants from surfaces resulting from a closed barrier etch (described above) that does not expose copper-containing material 22. The cleaning solution and methods described can be utilized to remove post-closed barrier etch contaminants from the surfaces of opening 32, including surfaces comprising barrier material 30. Such cleaning can be performed without substantially degrading material layer 30 or other exposed surfaces of opening 32 (discussed above).

It is to be understood that the present invention contemplates adaptation for use cleaning semiconductor surfaces other than copper. Such adaptation includes adaptation for both metallic and non-metallic surfaces.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method of forming an opening to a copper-containing material within a substrate, comprising:

providing a substrate comprising a semiconductive material;

forming a first opening within the semiconductive material;

after forming the opening, depositing a copper-containing material within the first opening;

providing a mass over the substrate and over the copper-containing material, the mass comprising at least one of an oxide barrier material and a dielectric material;

etching a second opening through the mass and to the copper-containing material, a surface of the copper-containing material forming a base of the second opening and thus defining a base surface of the second opening, said base surface being at least partially covered by at least one of a copper oxide, a silicon oxide and a copper fluoride; and cleaning the base surface with a mixture comprising, $NO_3^-$, $F^-$ and one or more organic acid anions to remove at least some of the at least one of a copper oxide, a silicon oxide and a copper fluoride from the base surface; wherein at least some of the organic acid anions comprise one or more carboxylate groups, and wherein the mixture has a pH of less than about 6.

2. The method of claim 1 wherein the copper-containing material consists essentially of elemental copper.

3. The method of claim 1 wherein the first opening comprises sidewalls and a surface the method further comprising depositing a copper-barrier layer within the first opening and over the sidewalls and surface of the opening, and wherein the providing the copper-containing material comprises providing the copper-containing material over the copper-barrier layer.

4. The method of claim 3 wherein the copper-barrier material comprises one or more members selected from the group consisting of Ta, TaN, Ti, TiN, and W.

5. The method of claim 1 wherein the oxide barrier material comprises one or more materials selected from the group consisting of $Al_2O_3$, $SiO_2$, aluminum nitride, silicon oxynitride, silicon carbide, and a composition comprising silicon, carbon and hydrogen.

6. The method of claim 1 wherein the dielectric material comprises one or more materials selected from the group consisting of $SiO_2$, SiO, low-k dielectric materials, and dielectric materials comprising silicon and oxygen.

7. The method of claim 1 wherein the mass comprises at least two layers, one of the at least two layers comprising the dielectric material and the other of the two layers comprising the oxide barrier material, and wherein the second opening is etched through both of the at least two layers.

8. The method of claim 1 wherein the base surface is at least partially covered by copper oxide, silicon oxide and copper fluoride; and wherein the cleaning removes substantially all of the copper oxide, silicon oxide and copper fluoride from the base surface.

9. The method of claim 1 wherein the mixture is an aqueous mixture comprising ionic components, and wherein the ionic components consists essentially of $NO_3^-$, $F^-$ and one or more organic acid anions, at least until the cleaning.

10. The method of claim 1 wherein the organic acid anion is selected from the group consisting of formate, acetate, propanoate, butanoate, and pentanoate.

11. The method of claim 1 wherein the mixture comprises a pH of greater than about 1 and less than about 4.

12. A method of cleaning a post-etch semiconductor surface comprising:

providing a substrate comprising a first layer comprising a first material selected from the group consisting of $Al_2O_3$, $SiO_2$, SiC, silicon oxynitride and compositions comprising silicon, carbon and hydrogen, and a second layer comprising a second material selected from the group consisting of SiO, $SiO_2$, and low-k dielectric materials, the first and second layers being disposed over a semiconductive material;

forming an opening through the first layer and through the second layer wherein the forming comprises etching to a third material at a base surface of the opening;

exposing the base surface to a cleaning solution formed from nitric acid, hydrofluoric acid, and one or more organic acids, at least some of the organic acids comprising one or more carboxylic acid groups.

13. The method of claim 12 wherein the etching comprises a closed barrier etch, and wherein the base surface comprises barrier material selected from the group consisting of a bottom anti-reflective material, a dielectric anti-reflective material, aluminum nitride and a silicon carbide material.

14. The method of claim 12 wherein the exposing comprises one or more of immersion, submersion, spraying, brush-scrubbing, spin-processing, agitation, megasonics and recirculation.

15. The method of claim 12 wherein the base surface comprises a copper-containing material selected from the group consisting of a copper alloys, a copper compound, and elemental copper.

16. The method of claim 12 wherein the forming the opening further comprises etching through a material selected from the group consisting of a bottom anti-reflective material, a dielectric anti-reflective material, aluminum nitride and a silicon carbide material.

17. The method of claim 12 wherein the first layer is over the second layer.

18. The method of claim 12 wherein the second layer is over the first layer.

* * * * *

UNITED STATES PATENT AND TRADEMARK OFFICE
CERTIFICATE OF CORRECTION

PATENT NO.    : 6,835,668 B2
DATED         : December 28, 2004
INVENTOR(S)   : Michael T. Andreas et al.

It is certified that error appears in the above-identified patent and that said Letters Patent is hereby corrected as shown below:

Column 5,
Line 62, replace "$NO_{3\text{-}}$" with -- $NO_3^-$ --.

Column 6,
Line 6, replace "$NO_{3\text{-}}$" with -- $NO_3^-$ --.
Lines 46 and 47, replace "where" with -- were --.

Signed and Sealed this

Twenty-eighth Day of June, 2005

JON W. DUDAS
*Director of the United States Patent and Trademark Office*